(12) United States Patent
Sato et al.

(10) Patent No.: US 7,727,585 B2
(45) Date of Patent: Jun. 1, 2010

(54) DIELECTRIC DEVICE AND ITS MANUFACTURING METHOD

(75) Inventors: Kei Sato, Tokai (JP); Nobuyuki Kobayashi, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 174 days.

(21) Appl. No.: 11/961,218

(22) Filed: Dec. 20, 2007

(65) Prior Publication Data
US 2008/0196227 A1 Aug. 21, 2008

(30) Foreign Application Priority Data
Feb. 19, 2007 (JP) ............................. 2007-038069
Jun. 5, 2007 (JP) ............................. 2007-148840

(51) Int. Cl.
*B05D 1/12* (2006.01)

(52) U.S. Cl. ...................................... 427/201; 427/193

(58) Field of Classification Search .................. 427/201, 427/193
See application file for complete search history.

(56) References Cited

U.S. PATENT DOCUMENTS 6,808,697 B2* 10/2004 Harada et al. ............... 423/598
2006/0012279 A1 1/2006 Nanataki et al.

FOREIGN PATENT DOCUMENTS

| JP | 04-188503 | 7/1992 |
|---|---|---|
| JP | 2002-217465 | 8/2002 |
| JP | 2004-043893 | 2/2004 |
| JP | 2005-183361 | 7/2005 |
| JP | 2005-344171 | 12/2005 |

OTHER PUBLICATIONS

Akedo et al., "Microstructure and Electrical Properties of Lead Zirconate Titanate $(Pb/Zr_{52}/Ti_{48})O_3)$ Thick Films Deposited by Aerosol Deposition Method". Jpn. J. Appl. Phys. vol. 38 (1999), pp. 5397-5401.

Adachi et al., "Preparation of Piezoelectric Thick Films using a Jet Printing System". Jpn. J. Appl. Phys. vol. 36 (1997), pp. 1159-1163.

* cited by examiner

*Primary Examiner*—Frederick J Parker
(74) *Attorney, Agent, or Firm*—Burr & Brown

(57) ABSTRACT

A manufacturing method of a dielectric device includes steps described below. (1) Mixing step: Powders serving as a matrix and additive powders for sintering the matrix are mixed. (2) Mixture heat-treating step: The mixture of the matrix and the additive that has been subject to the mixing step is heat-treated. (3) Deposition layer formation step: The material powders obtained through the mixture heat-treating step are injected toward a substrate so as to form a deposition layer on the substrate. (4) Deposition layer heat-treating step: The deposition layer formed on the substrate through the deposition layer formation step is heat-treated so as to form the dielectric layer on the substrate.

2 Claims, 6 Drawing Sheets

DIELECTRIC DEVICE AND ITS MANUFACTURING METHOD

BACKGROUND OF THE INVENTION

1. Field of the Invention

The present invention relates to a dielectric device having a dielectric layer formed on the substrate, and its manufacturing method.

2. Description of the Related Art

A known manufacturing method of a dielectric device includes a method for forming the dielectric layer on the substrate by injecting dielectric particles to the substrate (e.g., aerosol deposition method, etc.). The manufacturing method of this type is disclosed in, for example, Japanese Patent Application Laid-Open (kokai) No. 2004-43893, Japanese Patent Application Laid-Open (kokai) No. 2005-344171, or the like.

In the manufacturing method described above, crystallinity of the layer formed of the particles is deteriorated due to the collision between the substrate and the particles. Therefore, the formed layer is subject to a heat treatment. This heat treatment recovers the crystallinity of the dielectric layer, with the result that satisfactory characteristics (piezoelectric characteristic, etc.) of the dielectric layer can be obtained.

[Patent Document 1]
 Japanese Patent Application Laid-Open (kokai) No. 2004-43893

[Patent Document 2]
 Japanese Patent Application Laid-Open (kokai) No. 2005-344171

SUMMARY OF THE INVENTION

Demand has been increasing for realizing more satisfactory characteristics while enhancing deposition property of the dielectric layer.

The dielectric device according to the present invention includes a dielectric layer.

The dielectric layer may be formed on a predetermined substrate. A low heat-resistant substrate (silicon substrate, glass substrate, stainless substrate, etc.) can preferably be used for the substrate.

The dielectric layer is formed in such a manner that material powders are injected to form the deposition layer, and then, the deposition layer is subject to a heat treatment. The material powders are composed of heat-treated mixture. The mixture includes a dielectric and a sintering aid for sintering the dielectric.

A manufacturing method according to the present invention includes the steps described below.

(1) Mixing step: Powders that are a matrix and additive powders are mixed. In the present invention, a low melting point glass is used as the additive.

(2) Mixture heat-treating step: The mixture of the matrix and the additives that has been subject to the mixing step is heat-treated.

(3) Deposition layer formation step: The material powders obtained through the mixture heat-treating step are injected, thereby forming a deposition layer.

(4) Deposition layer heat-treating step: The deposition layer formed through the deposition layer formation step is heat-treated, thereby forming the dielectric layer.

The matrix is the dielectric or its raw material (precursor), and the additive is the sintering aid or its raw material.

Examples of preferably used dielectric include barium titanate, lead zirconate, magnesium niobate, lead nickel niobate, lead zinc niobate, lead manganese niobate, lead magnesium tantalate, lead nickel tantalate, lead antimony stannate, lead titanate, lead magnesium tungstate, lead cobalt niobate, sodium niobate, potassium niobate, potassium tantalate, sodium tantalate, lithium niobate, lithium tantalate, and ceramics containing arbitrary combination thereof. Specifically, lead zirconate titanate (PZT) and its solid solution (PMN (lead magnesium niobate)-PZT, PNN (lead nickel niobate)-PZT, PZN (lead zinc niobate)-PZT, etc.) can preferably be used as the dielectric.

The one containing any one of the above-mentioned materials in an amount of not less than 50 weight % as the main component can be used as the dielectric, for example.

Further, ceramic produced by further adding compounds such as oxides to the above can be preferably used as the dielectric. Examples of the above-mentioned oxides include lanthanum, calcium, strontium, molybdenum, tungsten, barium, niobium, zinc, nickel, manganese, cerium, cadmium, chrome, cobalt, antimony, iron, yttrium, tantalum, lithium, bismuth, tin, silicon, or the like. The above-mentioned oxides can be used singly, or in combination.

The term "low melting point glass" used herein is a term industrially generally employed, and even if this term is used in the claims, the use of this term does not make the disclosure of the claims unclear. The low melting point glass generally indicates a glass having a glass transition temperature of not more than 600° C. Known low melting point glasses include a lead-based low melting point glass having $ZnO$—$PbO$—$B_2O_3$, $PbO$—$SiO_2$—$B_2O_3$, $PbO$—$P_2O_5$—$SnF_2$, etc. as a main component, or non-lead-based low melting point glass having $V_2O_5$—$ZnO$—$BaO$, $Bi_2O_3$, $CuO$—$P_2O_5$, etc. as a main component.

In the manufacturing method of the present invention, the mixture of the matrix and the additive is heat-treated at the mixture heat-treating step. By virtue of this step, the additive can satisfactorily be permeated to the matrix before the deposition. Therefore, the additive satisfactorily functions as the sintering aid at the deposition layer heat-treating step.

According to the manufacturing method of the present invention, the dielectric layer having excellent characteristics can be formed with good deposition property. Specifically, according to the present invention, the dielectric device having excellent characteristics can also be manufactured with more stability.

In particular, when the mixture heat-treating step is performed at relatively high temperature (not less than 600° C., preferably not less than 800° C.), the heat treatment temperature in the deposition layer heat-treating step can be relatively low temperature (e.g., not more than 700° C.). In this case, the dielectric layer having more excellent characteristic can be formed with good deposition property even if a relatively low heat-resistant material (silicon substrate, glass substrate, stainless substrate, etc.) is used as the substrate.

A pulverizing step may be performed between the mixture heat-treating step and the deposition layer formation step. The pulverizing step is for obtaining the material powders by pulverizing the treated substance that has been subject to the heat treatment at the mixture heat-treating step.

BRIEF DESCRIPTION OF THE DRAWINGS

Various other objects, features and many of the attendant advantages of the present invention will be readily appreciated as the same becomes better understood by reference to the following detailed description of the preferred embodiment when considered in connection with the accompanying drawings, in which.

DETAILED DESCRIPTION OF THE INVENTION

A preferable embodiment of the present invention will be explained with reference to examples and comparative examples. The embodiment described below has been disclosed merely to illustrate representative embodiment of the present invention in order to satisfy the disclosure requirement (description requirement, enabling requirement) of the specification demanded by law. Accordingly, as stated below, it is not necessary to mention that the present invention is not limited to the specific configuration of the embodiment or examples described below. Various modifications of the embodiment or examples of the present invention are disclosed en bloc at the last of the specification, since if the various modifications are inserted into the explanation of the embodiment, a consistent understanding of the embodiment is hindered.

<Schematic Configuration of Dielectric Device>

Figure 1:
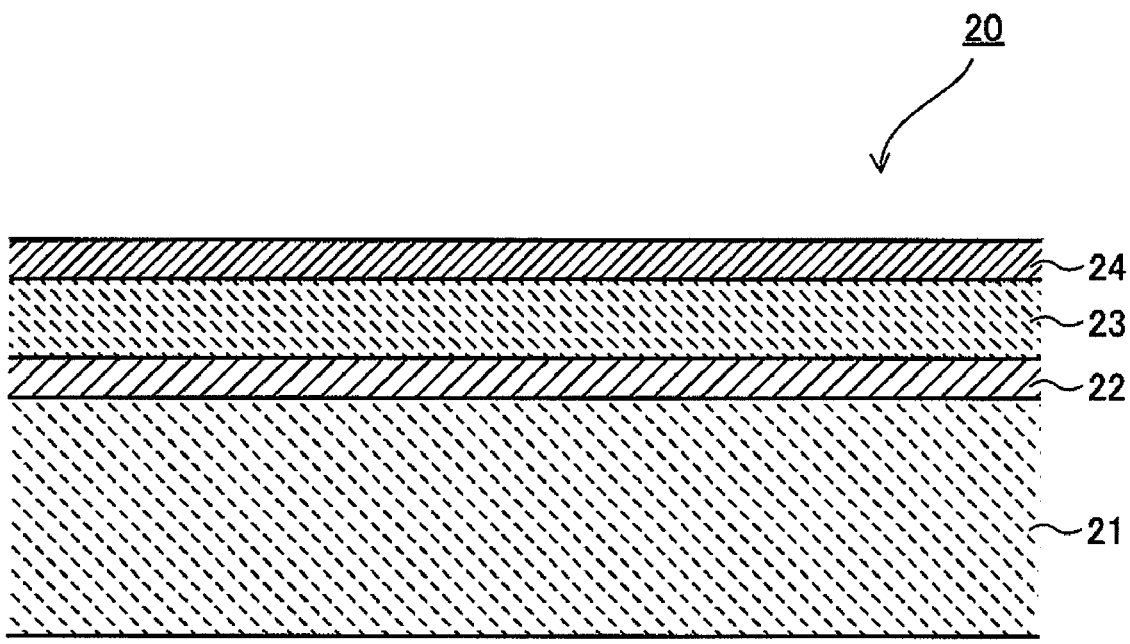
FIG. 1 is a cross-sectional view showing a schematic configuration of a dielectric device according to an embodiment of the present invention.

FIG. 1 is a cross-sectional view showing a schematic configuration of a dielectric device 20 according to the present embodiment.

Referring to FIG. 1, the dielectric device 20 includes a substrate 21, lower electrode 22, dielectric layer 23, and upper electrode 24.

The substrate 21 is formed of a low heat-resistant substrate (silicon substrate, glass substrate, stainless substrate, etc.). The lower electrode 22 made of a metallic film with a thickness of not more than 20 μm is formed on the substrate 21.

The dielectric layer 23 is formed on the lower electrode 22. The upper electrode 24 is provided on the dielectric layer 23. The upper electrode 24 is formed of a thin layer that has a thickness of about 0.1 to 20 μm and is made of a conductive substance.

Examples of the conductive substance constituting the upper electrode 24 include a metallic film, metallic particle, nonmetallic conductive film (carbon film or nonmetallic conductive oxide film, etc.), or nonmetallic conductive particle (carbon particle, conductive oxide particle, etc.).

Examples of the material for the metallic film or metallic particle include platinum, gold, silver, iridium, palladium, rhodium, molybdenum, and tungsten, and alloy of these materials.

Preferable examples of the material for the nonmetallic conductive film or nonmetallic conductive particle include graphite, ITO (indium tin oxide), or LSCO (lanthanum strontium cobalt oxide). Preferable shapes of particles in the case where the upper electrode 24 is made of a metallic particle or a nonmetallic conductive particle include a scale-like shape, plate-like shape, foil-like shape, acicular shape, rod-like shape, coiled spring-like shape, etc.

<Schematic Configuration of FED using Electron Emitter as Specific Example of Dielectric Device>

One specific example of the application of the dielectric device 20 according to the present embodiment will be explained below.

Figure 2:
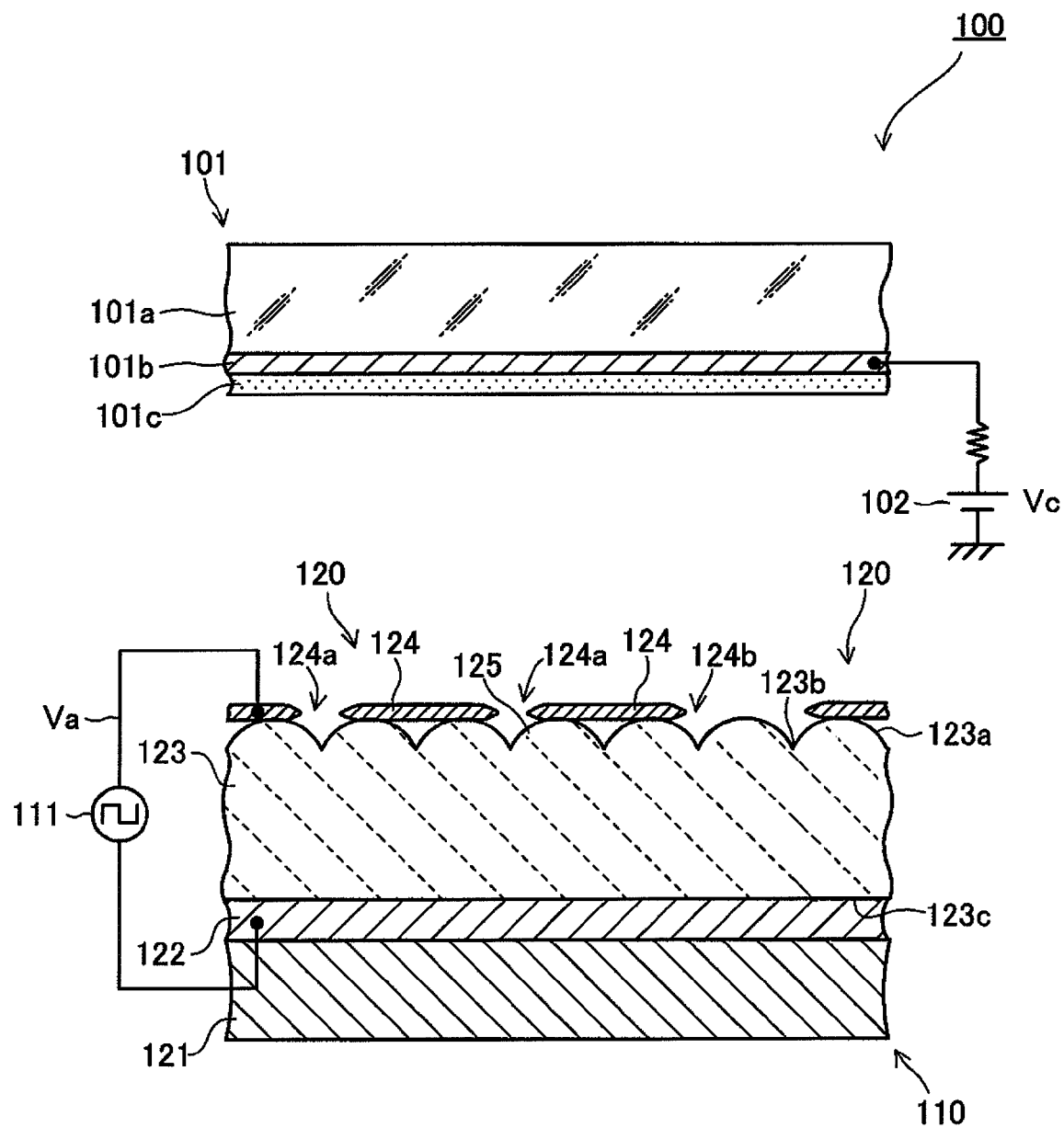
FIG. 2 is a cross-sectional view showing a schematic configuration of a display to which an electron emitter, which serves as a dielectric device, according to the present invention is applied.

FIG. 2 is a cross-sectional view showing a schematic configuration of a field emission display (FED) 100 to which the dielectric device 20 according to the present invention is applied.

With reference to FIG. 2, the FED 100 includes a light-emitting panel 101. The light-emitting panel 101 includes a transparent plate 101a, a collector electrode 101b, and a phosphor layer 101c.

The transparent plate 101a is formed of a glass plate or an acrylic plate. The collector electrode 101b is formed on the surface on the lower side in FIG. 2 of the transparent plate 101a. The collector electrode 101b is formed of a transparent electrode such as an ITO (indium tin oxide) thin film.

The phosphor layer 101c is formed below the collector electrode bib. The phosphor layer 101c is configured such that when electrons flying toward the collector electrode 101b, which is connected to a bias voltage source 102 via a predetermined resistor, collide with the phosphor layer 101c so fluorescence can be emitted. The bias voltage source 102 is configured to apply a predetermined collector voltage Vc between the ground and the collector electrode 101b.

An electron-emitting device 110 is provided below the light-emitting panel 101. The electron-emitting device 110 is electrically connected to a pulse generator 111. The electron-emitting device 110 is configured such that when a drive voltage Va is applied thereto by means of the pulse generator 111, electrons are emitted toward the light-emitting panel 101 (the collector electrode 101b and the phosphor layer 101c).

A predetermined space is provided between the electron-emitting device 110 and the light-emitting panel 101 (phosphor layer 101c). The space between the electron-emitting device 110 and the phosphor layer 101c is a reduced-pressure atmosphere having a predetermined vacuum level of, for example, $10^2$ to $10^{-6}$ Pa, and more preferably, $10^{-3}$ to $10^{-5}$ Pa.

The FED 100 is configured such that electrons are emitted, to the reduced-pressure atmosphere, from the electron-emitting device 110 through application of the drive voltage Va to the device 110 by means of the pulse generator 111, and that, by means of an electric field generated through application of the collector voltage Vc, the thus-emitted electrons fly toward the collector electrode 101b and collide with the phosphor layer 101c, whereby fluorescence is emitted.

<Detailed Configuration of Electron Emitter as Specific Example of Dielectric Device>

The electron-emitting device 110 is configured so as to have a thin flat plate shape. The electron-emitting device 110 includes a number of two-dimensionally arranged electron emitters 120 serving as the dielectric device 20 according to the present embodiment.

Each of the electron emitters 120 includes a substrate 121, a lower electrode 122, a dielectric layer 123, and an upper electrode 124.

The substrate 121 is formed of a low heat-resistant substrate (silicon substrate, glass substrate, stainless substrate, etc.). The lower electrode 122 is formed on the substrate 121. The lower electrode 122 is made of a metal film having a thickness not more than 20 μm. The lower electrode 122 is electrically connected to the aforementioned pulse generator 111. The dielectric layer 123 is provided on the lower electrode 122.

Microscopic concavities and convexities due to, for example, crystal grain boundaries are formed on an upper surface 123a of the dielectric layer 123. Specifically, numerous concavities 123b are formed on the upper surface 123a.

The dielectric layer 123 is formed on the lower electrode 122 such that a lower surface 123c of the layer 123, which is opposite the upper surface 123a, is in intimate contact with the lower electrode 122. The upper electrode 124 is provided on the upper surface 123a of the dielectric layer 123. The upper electrode 124 is electrically connected to the aforementioned pulse generator 111.

The upper electrode 124 is formed of a thin layer that has a thickness of about 0.1 to 20 μm and is made of a conductive substance. Examples of the conductive substance constituting the upper electrode 124 include a metallic film, metallic particle, nonmetallic conductive film (carbon film or nonmetallic conductive oxide film, etc.), or nonmetallic conductive particle (carbon particle, conductive oxide particle, etc.).

Examples of the material for the metallic film or metallic particle include platinum, gold, silver, iridium, palladium, rhodium, molybdenum, and tungsten, and alloy of these materials. Preferable examples of the material for the nonmetallic conductive film or nonmetallic conductive particle include graphite, ITO (indium tin oxide), or LSCO (lanthanum strontium cobalt oxide). Preferable shapes of the particles where the upper electrode 124 is made of a metallic particle or nonmetallic conductive particle include a scale-like shape, plate-like shape, foil-like shape, acicular shape, rod-like shape, coiled spring-like shape, etc.

The upper electrode 124 has a plurality of openings 124a. The openings 124a are formed such that the upper surface 123a of the dielectric layer 123 is exposed to the outside of the electron-emitting device 110 (i.e., the aforementioned reduced-pressure atmosphere; the same shall apply hereinafter). The upper surface 123a of the dielectric layer 123 is exposed to the outside of the electron-emitting device 110 also at peripheral edge portions 124b of the upper electrode 124. A portion of the dielectric layer 123 exposed to the outside of the electron-emitting device 110 constitutes an emitter section 125, which serves as a main section for electron emission.

As described below, the electron emitter 120 is configured such that electrons supplied from the upper electrode 124 are accumulated on the emitter section 125, and the thus-accumulated electrons are emitted toward the outside of the electron-emitting device 110 (i.e., toward the phosphor layer 101c).

Figure 3:
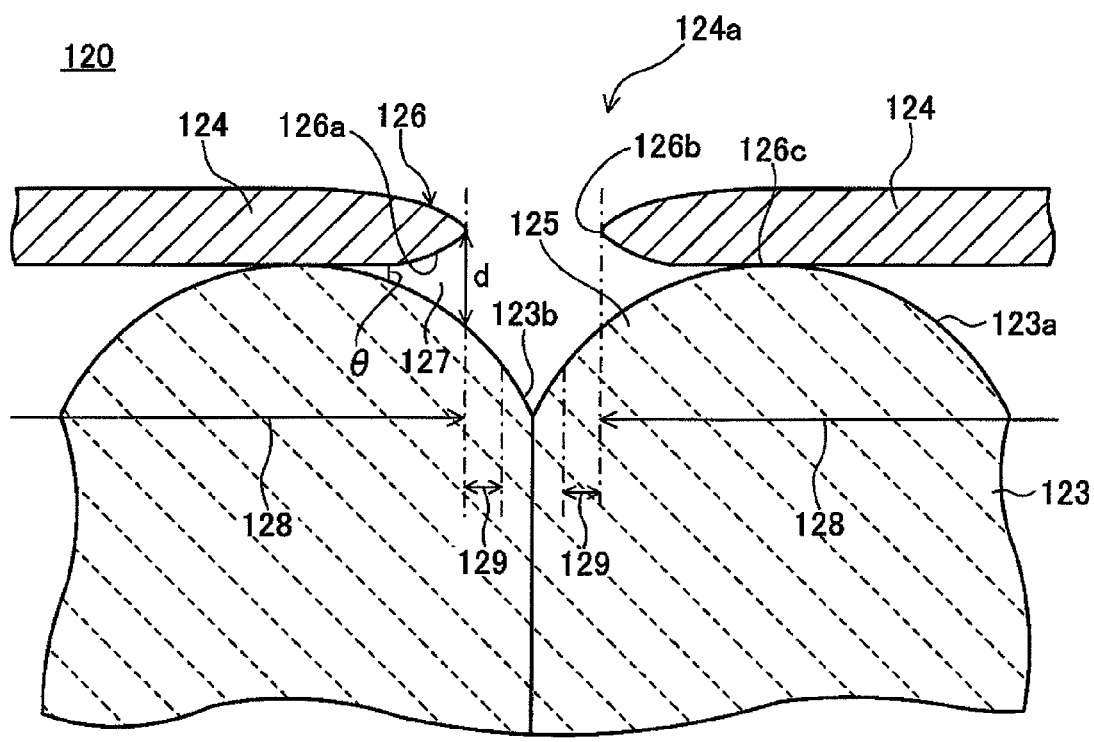
FIG. 3 is an enlarged cross-sectional view showing essential portions of the electron emitter shown in FIG. 2.

FIG. 3 is an enlarged cross-sectional view showing essential portions of the electron emitter 120 of FIG. 2. In the case shown in FIG. 2 or FIG. 3, the concavities 123b and the openings 124a are formed in one-to-one correspondence. However, in some cases, a plurality of concavities 123b may be formed in a single opening 124a, or no concavities 123b may be formed in an opening 124a.

Referring to FIG. 3, in the upper electrode 124, an overhang portion 126, which is a portion in the vicinity of the opening 124a, is provided so as to overhang the emitter section 125. Specifically, the overhang portion 126 is formed such that a lower surface 126a and a tip end 126b of the overhang portion 126 are apart from the upper surface 123a of the dielectric layer 123 corresponding to the emitter section 125. The overhang portion 126 is also formed at positions corresponding to the peripheral edge portions 124b (see FIG. 2) of the upper electrode 124.

A triple junction 126c is formed at a position of the base end at which the overhang portion 126 is in contact with the upper surface 123a of the dielectric layer 123; i.e., at a position at which the dielectric layer 123 is in contact with the upper electrode 124 and the aforementioned reduced-pressure atmosphere.

The triple junction 126c is a site (electric field concentration point) at which lines of electric force concentrate (where electric field concentration occurs) when, as shown in FIG. 2, a drive voltage Va is applied between the lower electrode 122 and the upper electrode 124. As used herein, the expression "site at which lines of electric force concentrate" refers to a site at which lines of electric force that are generated from the lower electrode 122 at even intervals concentrate, when the electric force lines are drawn under the assumption that the lower electrode 122, the dielectric layer 123, and the upper electrode 124 are flat plates each having infinite length in a sectional side view. The state of the concentration of lines of electric force (i.e., the state of electric field concentration) can be readily observed through simulation by means of numerical analysis employing the finite-element method.

Referring again to FIG. 3, a gap 127 is formed between the lower surface 126a and tip end 126b of the overhang portion 126 and the upper surface 123a (emitter section 125) of the dielectric layer 123. The gap 127 is formed such that the maximum gap d satisfies the following relation: $0\ \mu m < d \leq 10\ \mu m$, and the angle θ between the lower surface 126a and the surface of the emitter section 125 satisfies the following relation: $0° < \theta \leq 60°$.

The tip end 126b of the overhang portion 126 has such a shape as to serve as the aforementioned electric field concentration point. Specifically, the overhang portion 126 has such a cross-sectional shape as to be acutely pointed toward the tip end 126b of the portion 126; i.e., the thickness gradually decreases.

The openings 124a may be formed to assume a variety of shapes as viewed in plane (as viewed from above in FIG. 3), including a circular shape, an elliptical shape, a polygonal shape, and an irregular shape. The openings 124a are formed such that the average of diameters of the openings 124a as viewed in plane is 0.1 μm or more and 20 μm or less. The reason for this is described below. As used herein, the expression "the average of diameters of the openings 124a" refers to the number-based average of diameters of circles having areas identical to those of the openings 124a.

As shown in FIG. 3, regions of the dielectric layer 123 where polarization is inverted in accordance with application of the aforementioned drive voltage (drive voltage Va shown in FIG. 2) are first regions 128 and second regions 129. The first regions 128 correspond to regions facing the upper electrode 124. The second regions 129 correspond to regions extended from the tip ends 126b of the overhang portions 126 toward the centers of the openings 124a to some extent. The range of the second regions 129 varies depending on the level of the drive voltage Va and the degree of electric field concentration in the vicinity of the second regions 129.

When the average diameter of the openings 124a falls within the above-described range (i.e., 0.1 μm or more and 20 μm or less), a sufficient quantity of electrons are emitted through the openings 124a, and high electron emission efficiency is secured.

When the average diameter of the openings 124a is less than 0.1 μm, the area of the second regions 129 decreases. The second regions 129 constitute primary regions of the emitter section 125 which temporarily accumulates electrons supplied from the upper electrode 124 and then emits the electrons. Therefore, a decrease in area of the second regions 129 results in reduction of the quantity of electrons to be emitted. In contrast, when the average diameter of the openings 124a exceeds 20 μm, the ratio of the second regions 129 to the entirety of the emitter section 125 (occupancy of the second regions) decreases, resulting in reduction of electron emission efficiency.

<Electron Emission Principle of Electron Emitter>

Figure 4:
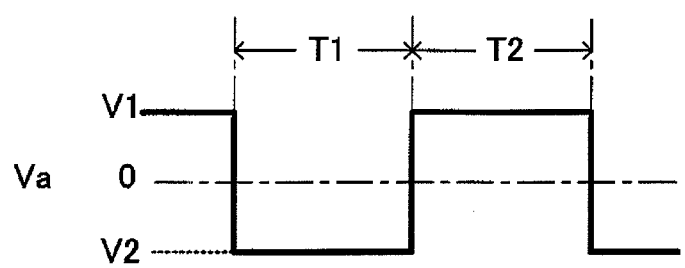
FIG. 4 is a diagram showing a waveform of a driving voltage applied to the electron emitter shown in FIG. 2.

FIG. 4 is a diagram showing the waveform of a drive voltage Va applied to the electron emitter 120 shown in FIG. 2. FIGS. 5A to 5C and FIGS. 6A to 6C each show the state of operation of the electron emitter 120 of FIG. 2 in the case where the drive voltage Va shown in FIG. 4 is applied to the electron emitter 120. Next will be described the principle of electron emission of the electron emitter 120 with reference to FIGS. 4 to 6C.

In the present embodiment, as shown in FIG. 4, the drive voltage Va to be applied is an alternating voltage of rectangular waveform (period: T1+T2). In the drive voltage Va, the reference voltage (voltage corresponding to the center of the wave) is 0 V.

In the drive voltage Va, during time T1 corresponding to the first stage, the electric potential of the upper electrode 124 is V2 (negative voltage), which is lower than the electric potential of the lower electrode 122, and during time T2 corresponding to the second stage, the electric potential of the upper electrode 124 is V1 (positive voltage), which is higher than the electric potential of the lower electrode 122.

Figure 5A:
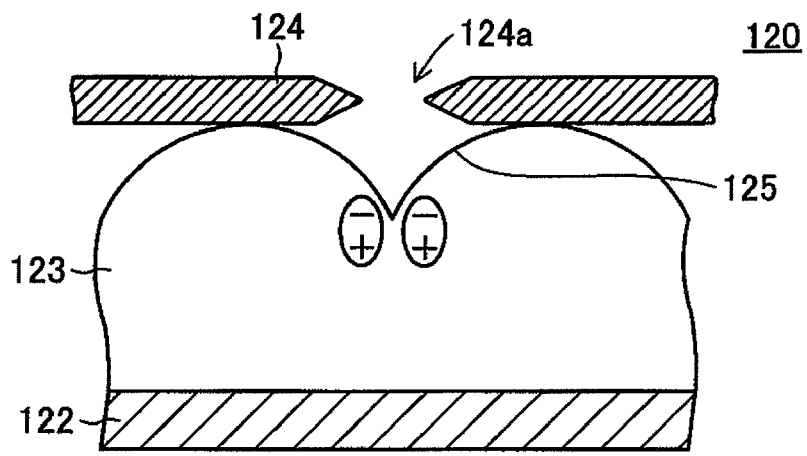
FIG. 5A is a schematic view for explaining an operation of the electron emitter shown in FIG. 2.

As shown in FIG. 5A, in the initial state, the emitter section 125 is polarized unidirectionally, and the negative poles of dipoles face toward the upper surface 123a of the dielectric layer 123.

Firstly, in the initial state, in which the reference voltage is applied, as shown in FIG. 5A, the emitter section 125 is polarized such that the negative poles of dipoles face toward the upper surface 123a of the dielectric layer 123. In this state, virtually no electrons are accumulated on the emitter section 125.

Figure 5B:
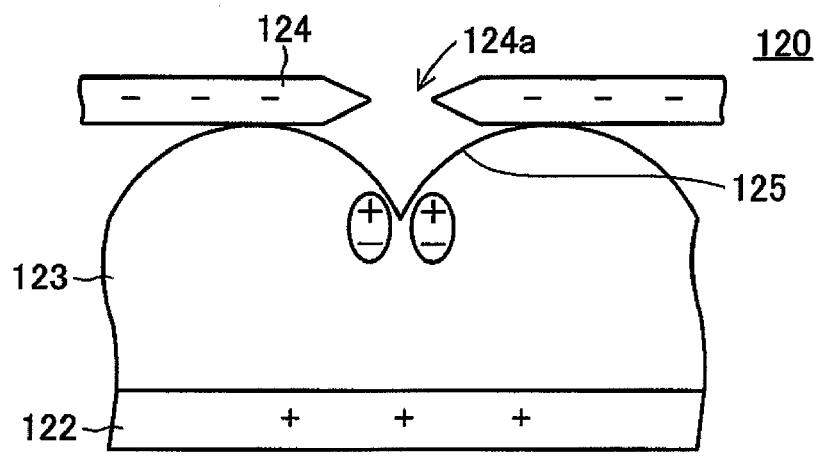
FIG. 5B is a schematic view for explaining an operation of the electron emitter shown in FIG. 2.
Figure 5C:
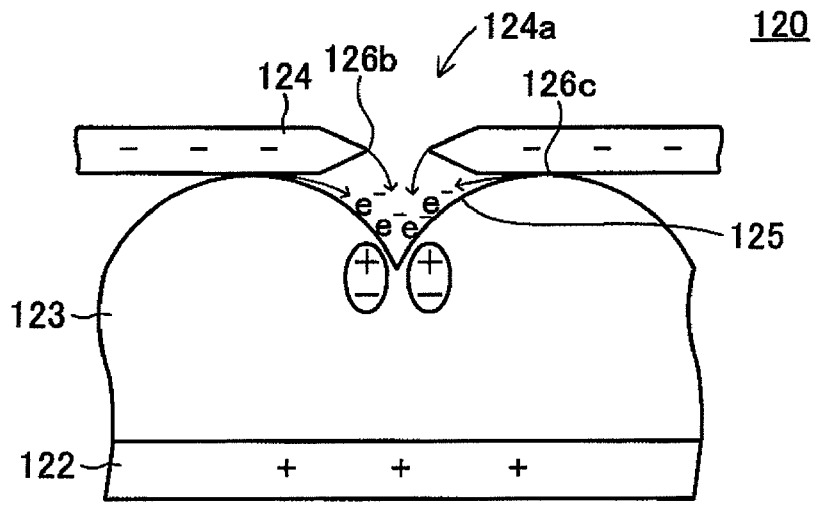
FIG. 5C is a schematic view for explaining an operation of the electron emitter shown in FIG. 2.

Subsequently, as shown in FIG. 5B, when the negative voltage V2 is applied, the polarization is inverted. This inversion of polarization causes electric field concentration to occur at the aforementioned electric field concentration points. Through this electric field concentration, electrons are supplied from the electric field concentration points of the upper electrode 124 toward the emitter section 125, and then, as shown in FIG. 5C, electrons are accumulated on the emitter section 125. In other words, the emitter section 125 is electrically charged. This electrical charging can be continued until a predetermined saturated condition, depending on the surface resistance of the dielectric layer 123, is attained. The quantity of the charge is controlled on the basis of voltage application time or voltage waveform. Thus, the upper electrode 124 (in particular, the aforementioned electric field concentration points) functions as an electron supply source for the emitter section 125.

Figure 6A:
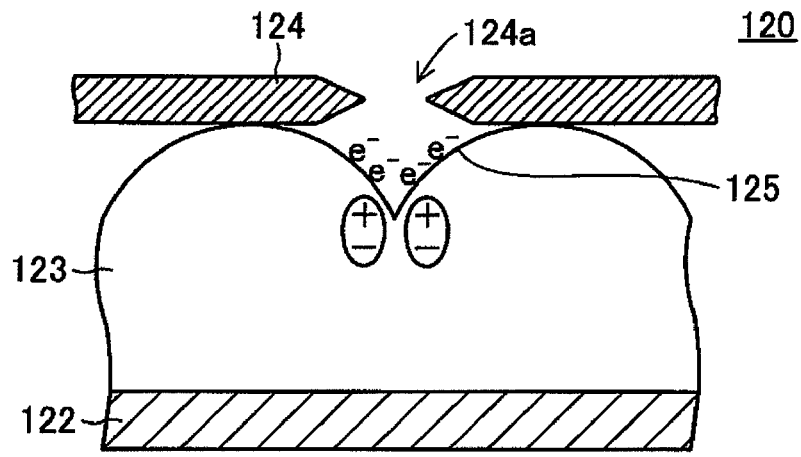
FIG. 6A is a schematic view for explaining an operation of the electron emitter shown in FIG. 2.
Figure 6B:
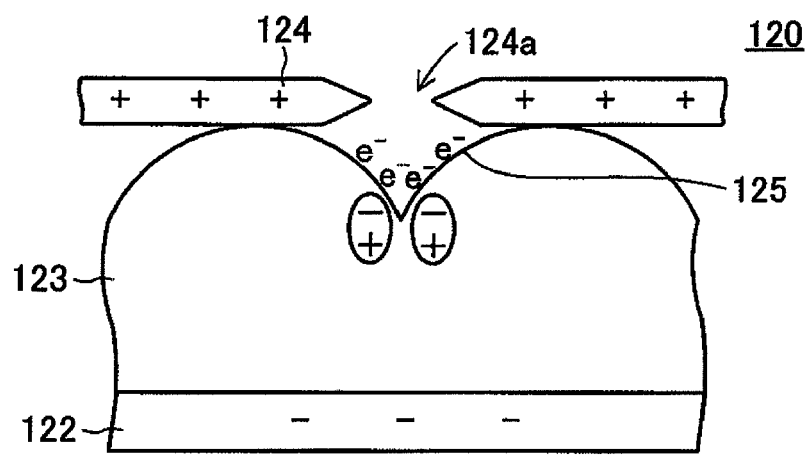
FIG. 6B is a schematic view for explaining an operation of the electron emitter shown in FIG. 2.
Figure 6C:
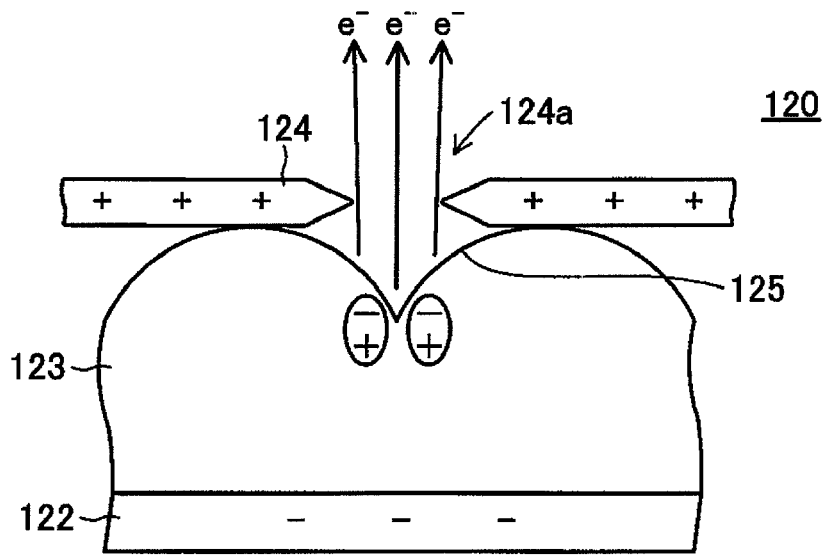
FIG. 6C is a schematic view for explaining an operation of the electron emitter shown in FIG. 2.

Subsequently, when the drive voltage Va is changed to the reference voltage as shown in FIG. 6A, the positive voltage V1 is then applied as the drive voltage Va as shown in FIG. 6B, and the polarization is re-inverted. As a result, electrostatic repulsion between the accumulated electrons and the negative poles of dipoles causes the electrons to be emitted from the emitter section 125 toward the outside of the electron emitter 120 through the opening 124a as shown in FIG. 6C.

In a manner similar to that described above, electrons are emitted from the peripheral edge portions 124b (see FIG. 2) of the upper electrode 124.

<Dielectric Device Manufacturing Method>

Figure 7:
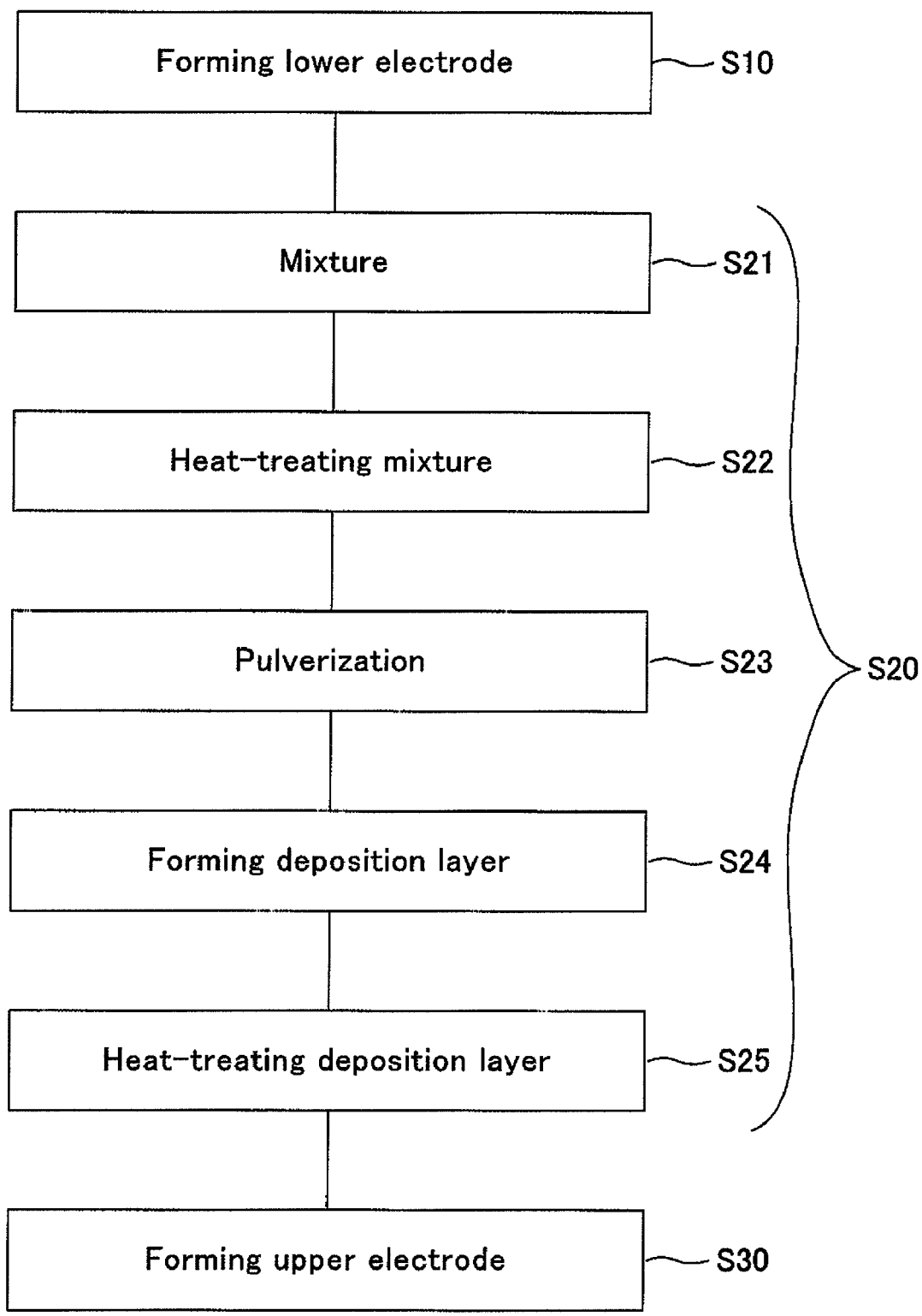
FIG. 7 is a process flow chart showing an embodiment of a manufacturing method of the dielectric device shown in FIG. 1.

FIG. 7 is a process flowchart showing one example of a manufacturing method of the dielectric device 20 shown in FIG. 1. One embodiment of the manufacturing method of the dielectric device will be explained below with reference to FIGS. 1 to 7.

Firstly, a lower electrode 22 is formed on a substrate 21 (the lower electrode formation step S10). In the lower electrode formation step S10, an applied film of a metallic paste is formed by a screen printing. Then, this applied film is heat-treated. Thus, the lower electrode 22 made of the metallic film is formed on the substrate 21.

Next, a dielectric layer 23 is formed on the lower electrode 22 formed on the substrate 21 (dielectric layer formation step S20). In the dielectric layer formation step S20, a mixing step S21, a mixture heat-treating step S22, a pulverizing step S23, a deposition layer formation step S24, and a deposition layer heat-treating step S25 are performed.

Firstly, in the mixing step S21, dielectric powders and sintering aid powders are mixed by means of a ball mill.

Then, in the mixture heat-treating step S22, the mixture of the dielectric powders and sintering aid powders is heat-treated.

Subsequently, in the pulverizing step S23, the heat-treated mixture of the dielectric powders and sintering aid powders is pulverized by means of a ball mill to have a particle diameter that can satisfactorily be formed into a film by an aerosol deposition method. Thus, material powders in the aerosol deposition method can be obtained.

Thereafter, in the deposition layer formation step S24, the above-mentioned material powders are injected on the lower electrode 22 formed on the substrate 21 by the aerosol deposition method. Thus, a deposition layer is formed on the lower electrode 22.

Finally, in the deposition layer heat-treating step S25, the above-mentioned deposition layer is heat-treated. Thus, the crystallinity is recovered, so that the dielectric layer 23 having an excellent dielectric property can be obtained.

An upper electrode 24 is formed on the dielectric layer 23, which is formed on the substrate 21 as described above, by a screen printing method similar to the lower electrode formation step S10 (upper electrode formation step S30).

EXAMPLES

Next will be described, with reference to Comparative Examples, Examples of the aforementioned manufacturing method of the dielectric device 20.

In each of the Examples and Comparative Examples, a platinum electrode serving as the lower electrode 22 is formed, by a screen printing method, on the substrate 21 made of a stabilized zirconia at the lower electrode formation step S10. Next, the dielectric layer 23 having a thickness of about 5 to 7 μm is formed by an aerosol deposition method on the platinum electrode at the dielectric layer formation step S20. The mixing condition in the mixing step S21 is such that the mixing is performed for three hours by using a ball mill. Subsequently, in the upper electrode formation step S30, a gold electrode serving as the upper electrode 24 is formed by a screen printing method.

In each of the Examples and Comparative Examples, a solid solution of lead zinc niobate and lead zirconate titanate (PZN-PZT) is used as the matrix. The PZN-PZT as the matrix is 0.15 PZN (Zn1/3Nb2/3)-0.85 PZT (Zr/Ti=0.52:0.48). This is a solid solution in which mole fraction of lead zinc niobate, having a ratio of zinc to niobium of 1/3:2/3, and lead zirconate titanate having a ratio of zirconium to titanate of 0.52:0.48, is 0.15:0.85. This matrix is referred to as "ZN" below.

$PbO$—$ZnO$—$B_2O_3$—$SiO_2$ glass (PbO: 60 mol %, ZnO: 25 mol %, $B_2O_3$: 10 mol %, $SiO_2$: 5 mol %, glass transition point: 385° C., softening point: 440° C.) is used as the low melting point glass serving as additive.

The deposition condition in the aerosol deposition method is as follows: gas flow rate: 6 liters/min, chamber pressure: 80 to 2000 Pa, substrate-nozzle distance: 5 mm, nozzle opening: 10×0.4 mm.

Example 1

Table 1 shows the result of the evaluation of deposition property. The "calcination condition" in Table 1 indicates the heat-treatment temperature and heat-treatment time in the mixture heat-treating step S22, while the "pulverization condition" indicates the processing time in the pulverizing step S23. The "deposition property" indicates whether the deposition layer is satisfactorily formed or not in the deposition layer formation step S24.

TABLE 1

| | Matrix | Additive | Calcination condition | Pulverization condition | Deposition property |
|---|---|---|---|---|---|
| Comparative Example 1-1 | ZN | — | — | — | ⊚ |
| Comparative Example 1-2 | ZN | Low melting point glass | — | — | X |
| Example 1-1 | ZN | Low melting point glass | 600° C. × 3 h | 3 h | ○ |
| Example 1-2 | ZN | Low melting point glass | 700° C. × 3 h | 3 h | ⊚ |

In the Comparative Example 1-2 in which the low melting point glass serving as additive is only mixed, the layer can not be formed. On the other hand, in the Examples 1-1 and 1-2 in which the mixture heat-treating step S22 is performed after the low melting point glass as the additive is mixed, the layer can be formed.

Example 2

Next, Tables 2 and 3 show the effect of enhancing the dielectric property in the Examples. As shown in Table 3, a remnant polarization Pr (μC/cm²) is taken as the evaluation item.

The remnant polarization Pr is obtained from a hysteresis curve by the application of AC electric field of a triangular wave having a frequency of 100 Hz and amplitude of 200 kV/cm. The remnant polarization Pr in case where the heat-treatment temperature at the deposition layer heat-treating step S25 is 600° C. and the remnant polarization Pr in case where the heat-treatment temperature at the deposition layer heat-treating step S25 is 700° C. are respectively measured.

TABLE 2

| | Matrix | Additive | Calcination condition | Pulverization condition |
|---|---|---|---|---|
| Example 2-1 | ZN | Low melting point glass | 800° C. × 3 h | 3 h |
| Example 2-2 | ZN | Low melting point glass | 900° C. × 3 h | 3 h |
| Example 2-3 | ZN | Low melting point glass | 1000° C. × 3 h | 3 h |

TABLE 3

| | $Pr[\mu C/cm^2]$ (Heat-treatment 600° C. after deposition) | $Pr[\mu C/cm^2]$ (Heat-treatment 700° C. after deposition) |
|---|---|---|
| Comparative Example 1-1 | 9.2 | 13.6 |
| Example 2-1 | 11.3 | 20.7 |
| Example 2-2 | 11.0 | 20.1 |
| Example 2-3 | 11.4 | 21.5 |

As apparent from the result of the evaluation, the property of the Examples 2-1 to 2-3 in which the mixture heat-treating step S22 is performed is enhanced than the properties of the Comparative Example 1-1 having no additive.

Comparing the Examples 2-1 to 2-3, the effect of enhancing the property by the deposition layer formation step S22 increases according to the rise of the heat treatment temperature (calcination temperature).

In particular, when the heat treatment temperature in the mixture heat-treating step S22 is relatively high such as not less than 800° C., a dielectric layer having excellent characteristic can be obtained, even if the heat treatment temperature in the deposition layer heat-treating step S25 is relatively low such as 600 to 700° C. According to the relatively low heat treatment temperature in the heat-treating step S25, a substrate having relatively low heat resistance (silicon substrate, glass substrate, stainless substrate, etc.) can satisfactorily be employed as the substrate 21.

As explained above, in the present invention, a matrix and a low melting point glass serving as a sintering aid are mixed and then calcinated, whereby the sintering aid is sufficiently permeated into the matrix, and therefore, a dense deposition is performed. By the heat treatment (deposition layer heat-treating step) after the deposition, a growth of a crystallite grain or a defect recovery are carried out, whereby various characteristics (piezoelectric characteristics such as remnant polarization, piezoelectric constant, electric-field-induction strain, vibration characteristic such as mechanical quality coefficient, and others) as the dielectric can be enhanced. Accordingly, a dielectric layer having excellent characteristics can be formed with excellent deposition property according to the present invention.

Since the heat treatment temperature in the mixture heat-treating step is relatively high (e.g., not less than 800° C.), the property is satisfactorily enhanced, even if the heat treatment temperature in the deposition layer heat-treating step is relatively low (e.g., not more than 700° C.). Thus, a substrate having relatively low heat resistance (silicon substrate, glass substrate, stainless substrate, etc. can be used.

<Suggestion of Modifications>

The above-described embodiment has been disclosed merely to illustrate representative embodiment of the present invention considered as the most preferred embodiments at the time of filing of the present application. Consequently, the present invention is not limited to the above-described embodiments, and it is appreciated that various modifications are possible without changing essential parts of the present invention.

Hereinafter, a few modifications will be illustrated below. In the explanation of the modifications below, like reference numerals refer to like components. In the explanation for the components, the explanation for the above-mentioned embodiment can be quoted within the scope of technical consistency.

It is not necessary to mention that the modifications are not limited to those described below. Further, plural modifications can appropriately be combined with each other within the scope of technical consistency.

The present invention (the components constituting the means to solve the problems of the present invention, which are expressed operatively and functionally) should not be limited based on the disclosures of the embodiments described above and the modifications described below. Limiting the present invention is not allowed because the limitation trespasses on benefits of the applicant (who has hastened to file the application under the first-to-file rule), the limitation provides imitators with undue profits, and therefore, the limitation is opposed to the purpose of the patent law prescribing the protection and utilization of the invention.

The dielectric device according to the present invention is not limited to an electron emitter. The present invention is satisfactorily applicable to an optional dielectric device (piezoelectric actuator, piezoelectric transformer, piezoelectric speakers, filter, etc.) utilizing various characteristics (piezoelectric characteristic, vibration characteristic, etc.) of a dielectric.

Besides the mixture by means of a ball mill, various mixing steps are applicable in the mixing step S21.

The mixture heat-treating step S22 can be performed simultaneous with the mixing step S21, or can be performed during the mixing step S21.

The pulverizing step S23 can be omitted.

The deposition layer formation step S24 is not limited to an aerosol deposition method.

The deposition layer heat-treating step S25 can be carried out as the heat-treating step, which is performed subsequent to the screen printing, etc., in the upper electrode formation step S30.

In addition, the respective components constituting the means to solve the problems of the present invention, particularly, the components which are expressed operatively and functionally, include all structures that can be operatively and functionally realized in addition to the clearly defined structures disclosed in the above-described embodiments and modifications.

What is claimed is:

1. A manufacturing method of a dielectric device comprising:
    a mixing step in which powders serving as a matrix and powders of low melting point glass serving as an additive for sintering the matrix are mixed;
    a mixture heat-treating step in which the mixture of the matrix and the additive that has been subject to the mixing step is heat-treated;
    a deposition layer formation step in which material powders obtained through the mixture heat-treating step are injected to a substrate so as to form a deposition layer on the substrate; and
    a deposition layer heat-treating step in which the deposition layer formed on the substrate through the deposition layer formation step is heat-treated at less than 700° C. so as to form a dielectric layer on the substrate.

2. A manufacturing method of a dielectric device according to claim 1, further comprising:
    a pulverizing step in which a processed substance that has been heat-treated at the mixture heat-treating step is pulverized so as to obtain the material powders.

* * * * *